(12) United States Patent
Farahani Samani et al.

(10) Patent No.: US 9,490,754 B2
(45) Date of Patent: Nov. 8, 2016

(54) HIGH-FREQUENCY DRAIN POWER SUPPLY TO DECREASE POWER DISSIPATION IN CLASS-AB POWER AMPLIFIERS

(71) Applicant: INNOVARADIO SA, Plan-les-Ouates, GE (CH)

(72) Inventors: Amir Hooshang Farahani Samani, Lausanne (CH); Alexander Greber, Eich (CH); Jeyran Hezaveh, Lausanne (CH); Ali Asghar Talebi, Dearborn Heights, MI (US)

(73) Assignee: INNOVARADIO SA, Plan-les-Ouates (CH)

( * ) Notice: Subject to any disclaimer, the term of this patent is extended or adjusted under 35 U.S.C. 154(b) by 0 days.

(21) Appl. No.: 14/427,146

(22) PCT Filed: Sep. 10, 2013

(86) PCT No.: PCT/IB2013/058436
§ 371 (c)(1),
(2) Date: Mar. 10, 2015

(87) PCT Pub. No.: WO2014/037926
PCT Pub. Date: Mar. 13, 2014

(65) Prior Publication Data
US 2015/0249432 A1    Sep. 3, 2015

Related U.S. Application Data

(60) Provisional application No. 61/743,670, filed on Sep. 10, 2012.

(51) Int. Cl.
*H03G 3/20*      (2006.01)
*H03F 1/02*      (2006.01)
(Continued)

(52) U.S. Cl.
CPC ........... *H03F 1/0222* (2013.01); *H03F 1/0211* (2013.01); *H03F 3/19* (2013.01);
(Continued)

(58) Field of Classification Search
CPC ..................... H03F 1/0222; H03F 1/0227

USPC ................ 330/127, 136, 297; 455/127.1
See application file for complete search history.

(56) References Cited

U.S. PATENT DOCUMENTS

2006/0238244 A1 * 10/2006 Grundlingh ........... H03F 1/0211
                                                               330/136
2009/0111397 A1    4/2009 Dunsmore et al.
(Continued)

OTHER PUBLICATIONS

International Search Report issued in International Application No. PCT/IB2013/058436 dated Feb. 26, 2014.
Written Opinion issued in International Application No. PCT/IB2013/058436 dated Feb. 26, 2014.

*Primary Examiner* — Steven J Mottola
(74) *Attorney, Agent, or Firm* — DLA Piper LLP US

(57) ABSTRACT

The present invention relates to the control of power amplifiers in order to enhance the efficiency of the amplifier by tracking the envelope of input signal and applying the same envelope into the drain voltage of a last stage power transistor. This invention can be used in each and every wireless communication transmitter, since there is definitely a power amplifier in the last part of the transmitter before the antenna, and every power amplifier has limited power performance, depending on type of modulation, due to its input-output curve. We are aiming to enhance the power utility of power amplifiers in different applications through introducing a new method and circuit for supplying power into a power amplifier, wherein the power supplied to the drain of the power amplifier is made to follow the envelope of the transmitted RF signal. Embodiments of the invention provide for a drain power supply module to drive the drain of a power amplifier, wherein an array of parallel amplifiers is controlled, depending on the envelope, to switch at different phases.

9 Claims, 3 Drawing Sheets

(51) Int. Cl.
*H03F 3/217* (2006.01)
*H03F 3/24* (2006.01)
*H03F 3/19* (2006.01)
*H03F 3/21* (2006.01)

(52) U.S. Cl.
CPC ........... *H03F 3/211* (2013.01); *H03F 3/2178* (2013.01); *H03F 3/245* (2013.01); *H03F 2200/102* (2013.01); *H03F 2200/351* (2013.01); *H03F 2200/451* (2013.01); *H03F 2203/21112* (2013.01)

(56) References Cited

U.S. PATENT DOCUMENTS

| | | |
|---|---|---|
| 2010/0109769 A1 | 5/2010 | Yamanouchi |
| 2010/0207703 A1 | 8/2010 | Dupuy et al. |
| 2012/0126893 A1 | 5/2012 | Yamanouchi et al. |
| 2012/0161867 A1 | 6/2012 | Dupuy et al. |
| 2012/0169414 A1 | 7/2012 | Dupuy et al. |
| 2012/0309333 A1 | 12/2012 | Nambu et al. |
| 2014/0028401 A1 | 1/2014 | Dupuy et al. |

* cited by examiner

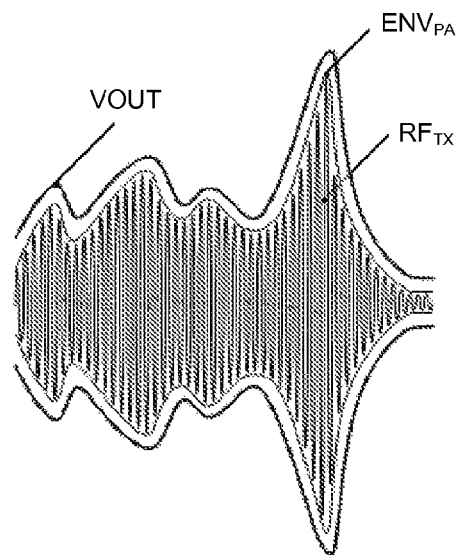
FIGURE 1: PRIOR ART
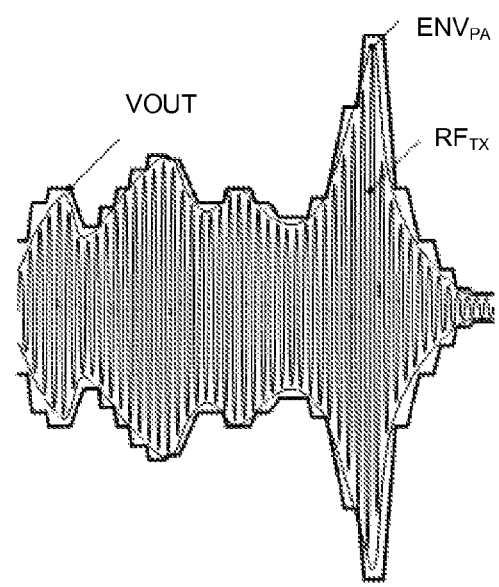
FIGURE 2

HIGH-FREQUENCY DRAIN POWER SUPPLY TO DECREASE POWER DISSIPATION IN CLASS-AB POWER AMPLIFIERS

CROSS REFERENCE TO RELATED APPLICATIONS

This application is a U.S. National Stage Application of International Application No. PCT/IB2013/058436 filed Sep. 10, 2013, which claims priority to U.S. Provisional Patent Application No. 61/743,670 filed Sep. 10, 2012.

TECHNICAL DOMAIN

The present invention concerns the field of power amplifiers and in particular the control of the amplifier through modulation of the supply of power output stage in order to enhance the efficiency of the amplifier. The invention is especially useful in the domain of wireless transmitters.

PRIOR ART

In wireless technologies such as telecommunication, digital radio, advanced mobile application like 3G and 4G "general base stations" as well as digital television broadcasting, radio frequency semiconductors like FETs, transistors and combinations of them are used to set up high power amplifiers, otherwise known as power amplifiers (PA). These components are used to amplify voltage and current to a certain level. Such power amplifiers typically operate in the Class A, Class AB or Class B mode. These output stages exhibit a low level of signal distortion but a high degree of dissipation power. Due to the typical conducting and switching losses as well as operation losses of the control unit, an additional amount of power is required. This extra power, also called dissipation power, is eventually converted to heat. The dissipated power is essentially determined by the supply voltage, the electrical load, the controllability, the signal amplitude and the output frequency.

As a result of dissipation power, for a desired amount of output power a multiple amount of supply power is required. The ratio between RF output power and supply power is called the efficiency ($\eta$) of the power amplifier, which ranges from 0% to 100%. The efficiency of a power amplifier depends on several parameters, most important ones: type of modulation, biasing circuitry (amplifier's class) and the output power. In the most advanced applications nowadays, typical values for the efficiency of power amplifiers with fixed supply voltage are between 15% and 30%. This low efficiency translates directly to higher cost of ownership of a wireless system, in the form of electricity bills!

Several efficiency enhancing technologies have been investigated in last decade, including the Doherty Amplifiers, Class F amplifiers, envelope elimination and restoration/envelope-tracking (EER/ET) and the LINC amplifier. While most of these technologies have been around theoretically for many years, commercialization has been elusive up until the last several years or so. Among all, envelope-tracking technique is going to be most promising way to achieve efficiencies up to 60% from current some 15% in most applications. The next drawing shows how a typical envelope-tracking power amplifier works.

To achieve the proper tracked waveform like what predicted in this figure, one should use linear amplifiers in the design of its power supply module (at least as part of its design). These linear amplifiers have low efficiency themselves, which result in total lower efficiency of a typical envelope-tracking power amplifier.

We are offering a novel method and system for a variable drain power supply to be used in a high-efficiency power amplifier, in which we don't use any linear amplifier, and so can reach much higher efficiencies than a regular envelope-tracking power supply. Next figure shows the concept.

Power amplifier circuits (output stages) are classified as A, B, AB and C for analog designs, and class D and E for switching designs based upon the conduction angle or 'angle of flow' $\Theta$ of the input signal through the amplifying device, that is, the portion of the input signal cycle during which the amplifying device conducts. The image of the conduction angle is derived from amplifying a sinusoidal signal. (If the device is always on, $\Theta=360°$.) The angle of flow is closely related to the amplifier power efficiency. The various classes of power amplifiers are introduced below.

Class A

100% of the input signal is used (conduction angle $\Theta=360°$ or $2\pi$, i.e. the active element works in its linear range all of the time). Where efficiency is not a consideration, most small signal linear amplifiers are designed as Class A, which means that the output devices are always in the conduction region. Class A amplifiers are typically more linear and less complex than other types, but are very inefficient. This type of amplifier is most commonly used in small-signal stages or for low-power applications (such as driving headphones).

Class B

50% of the input signal is used ($\Theta=180°$ or $\pi$, i.e. the active element works in its linear range half of the time and is more or less turned off for the other half). In most Class B, there are two output devices (or sets of output devices), each of which conducts alternately for exactly 180 deg (or half cycle) of the input signal; selective RF amplifiers can also be implemented using a single active element.

These amplifiers are subject to crossover distortion if the handoff from one active element to the other is not perfect, as when two complimentary transistors (i.e. one PNP, one NPN) are connected as two emitter followers with their base and emitter terminals in common, requiring the base voltage to slew across the region where both devices are turned off.

Class AB

Here the two active elements conduct more than half of the time as a means to reduce the crossover distortions of Class B amplifiers. In the example of the complementary emitter followers a bias network allows for more or less quiescent current thus providing an operating point somewhere between Class A and Class B. Sometimes a figure is added, e.g. AB1 or AB2, with higher figures implying a higher quiescent current and therefore more of the properties of Class A.

Class D

These use switching to achieve a very high power efficiency (more than 90% in modern designs). By allowing each output device to be either fully on or off, losses are minimized. The analog output is created by pulse width modulation (PWM), i.e. the active element is switched on for shorter or longer intervals instead of modifying its resistor. There are more complicated switching schemes like sigma-delta modulation, to improve some performance aspects like lower distortions or better efficiency.

Other Classes

There are several other amplifier classes, although they are mainly variations of the previous classes. For example, Class H and Class G amplifiers are marked by variation of the supply rails (in discrete steps or in a continuous fashion, respectively) following the input signal. Wasted heat on the output devices can be reduced as excess voltage is kept to a minimum. The amplifier that is fed with these rails itself can be of any class. These kinds of amplifiers are more complex, and are mainly used for specialized applications, such as very high-power units. Also, Class E and Class F amplifiers are commonly described in literature for radio frequencies applications where efficiency of the traditional classes deviates substantially from their ideal values. These classes use harmonic tuning of their output networks to achieve higher efficiency and can be considered a subset of Class C due to their conduction angle characteristics.

Each and every RF power amplifier distorts the input signal when the input signal power reaches close to saturation level of PA. These distortions can be modeled as AM/AM and AM/PM distortions which have described in a lot of literatures of communication. In some applications such as in OFDM systems, because of sensitivity of receivers to these types of distortions, the designers of total communication system use the PA in a sufficient margin from its saturation point to make sure that the output signal is not distorted more than acceptable threshold. Using different methods of pre-distortion, this margin can be reduced and the power utility of PA can be increased.

U.S. Pat. No. 7,482,869 B2 discloses a radio frequency amplification stage for driving an RF amplifier. The disclosure is directed towards the use of a plurality of predetermined power supply levels to be selected over time depending on an envelope signal which follows the evolution of the envelope of the signal to be amplified by the RF amplifier. The circuit uses linear amplifiers to track the envelope and it uses summation in order to provide for interpolation between the plurality of predetermined power supplies. Both of these features contribute to low efficiency. Furthermore, and disadvantageously, the summation circuitry generally includes a large inductance.

In United States Patent Application Publication number 2012/0,309,333 A1, a radio transmitter including a drain modulation power supply for supplying power to a power amplifier is described. Like the previous publication briefly described above, the drain modulation power supply of this publication also includes a plurality of voltage supplies in a serial architecture to change the output voltage in several steps. The power supply controller controls the plurality of current amplifying modules so as to precisely divide the main power supply voltage based on the voltage distribution of a received transmitted base band signal. The maximum speed of this circuitry is limited to maximum switching frequency of each current amplifying module.

BRIEF DESCRIPTION OF THE INVENTION

Drain modulation circuits and methods described in the state of the art present various problems which are addressed by embodiments of the present invention. Very fast switching speeds need to be achieved in order to accurately track the envelope of the RF signals in question. Furthermore, sufficient voltage levels with adequate current need to be provided to the power amplifier stage.

To this end, according to a first aspect the present invention provides for a method for supplying a modulated power signal to a power amplifier, the method comprising:
  receiving an envelope signal based on a modulation of an input signal used to drive the power amplifier;
  driving an array of at least two amplifying elements, the amplifying elements being connected in parallel such that they each are supplied by a substantially constant DC power supply, each amplifying element being driven during at least one phase, the at least one phase being independent of any other amplifying element, the at least one phase being based on the envelope signal and a feedback signal based on at least part of the modulated power signal.

According to a second aspect, provision is made for a drain modulation power supply module for supplying power to a power amplifier, the drain modulation power supply module comprising:
  a constant power input for receiving a substantially constant DC power supply;
  a digital input for receiving a processed digital envelope-signal based on an input signal used to drive the power amplifier; and
  a control circuit for generating a plurality of timing signals to switch on/off the amplifying elements;
characterised in that:
  the drain modulation power supply module further comprises an array of amplifying elements connected in parallel with each other, the array comprising at least two amplifying elements, each of the amplifying elements being driven by one from the plurality of timing signals, the control circuit being further configured to generate each timing signal on a phase-by-phase basis depending on the processed digital envelope signal.

According to a third aspect, a system is provided, comprising:
  a drain modulation power supply module according to an embodiment of the present invention, the drain modulation power supply module for supplying modulated power to a power amplifier; and
  a modulator;
characterised in that:
  the modulator is configured to process an input signal used to drive the power amplifier, said processing of the input signal yielding an envelope signal, and to provide the envelope signal to the drain modulation power supply module via the digital input; and
  the modulator is further configured to take a feedback signal based on the modulated power to the amplifier module to provide the envelope signal.

BRIEF DESCRIPTION OF THE DRAWINGS

The present invention and its advantages will be better understood thanks to the enclosed detailed description of a particular embodiment and to the enclosed drawings, in which:

FIG. 1 illustrates the main concept behind prior art drain modulation power supply;

FIG. 2 illustrates the main concept behind our novel idea of discrete-time drain modulation power supply, which benefits from total switching-based implementation of the device;

DETAILED DESCRIPTION

Figure 3:
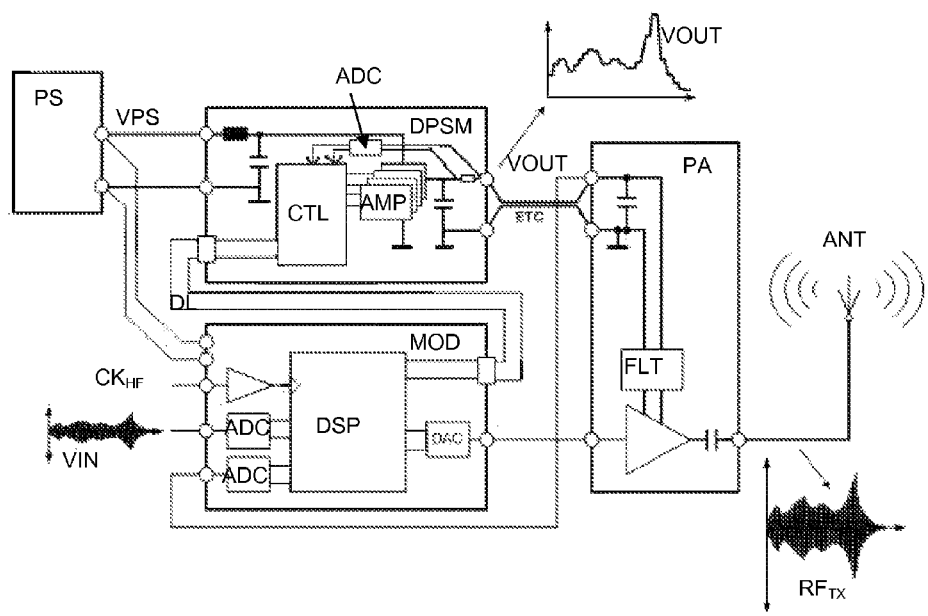
FIG. 3 illustrates the general embodiment of a wireless transmitter including power amplifier circuit and a drain power supply module according to an embodiment of the present invention.

A Drain Power Supply Module (DPSM) within an embodiment of a Power Amplifier Circuit is presented in FIG. 3.

This Drain Power Supply Module can be implemented as a stand-alone module or an integrated module within a power amplifier module.

Figure 4:
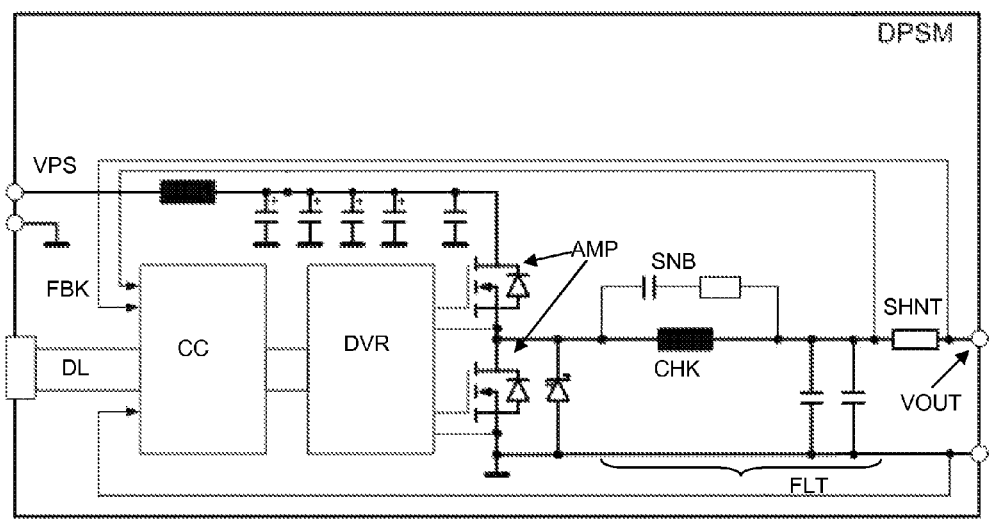
FIG. 4 illustrates a drain modulation power supply module according to an embodiment of the present invention, using a digital processed envelope as input and having a filter on its output stage.

As depicted in FIG. 4, "Control Circuit" (CC) receives digital processed envelope data through digital link (DL). Then it drives the driver circuitry (DVR), so that it drives several high-speed MOSFETs (AMP) (or FETs or transistors (AMP)) to generate the signal depicted in FIG. 2. High-speed MOSFETs (AMP), as described herein, are examples of amplifiers (AMP) (or amplifying devices (AMP) or amplifying elements (AMP) according to embodiments of the present invention).

Using the feedback samples (FBK) from output voltage (VOUT), the Control Circuit (CC) will correct its output to guarantee the output voltage will be tracking the envelope of signal correctly.

The connection between the DPSM and the power amplifier unit (PA), illustrated in FIG. 3, causes some resonances in the output signal and existing resonances may be stimulated easily, deteriorating the quality of the useful signal. In order to drastically reduce these effects, a particular connection type known as Flexible Print or Flex Print (ETC) is developed and being introduced. Flexible Print (ETC) is a novel connection which can be used between any power supply modulator and power amplifier. This connection consists of a multilayer flex print and features the following advantages:
1. drastic reduction of the serial induction;
2. reduction of radiated interference;
3. acts like an additional filter; and
4. allows for flexible connection for better system integration.

Figure 5A:
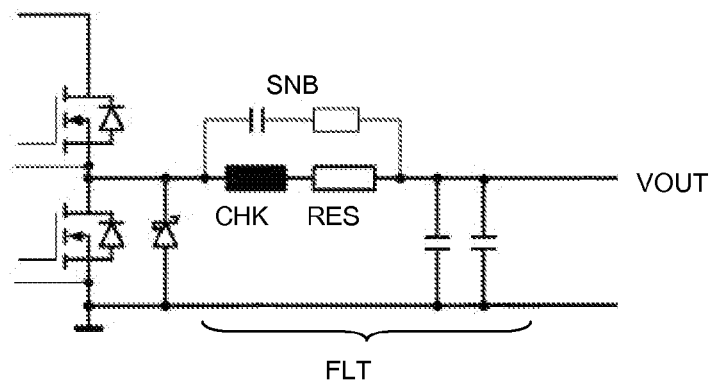
FIGS. 5a, 5b and 5c illustrate several possible circuit topologies for filters for the output stage of a drain power supply module according to an embodiment, which prevent potential unwanted oscillations.
Figure 5B:
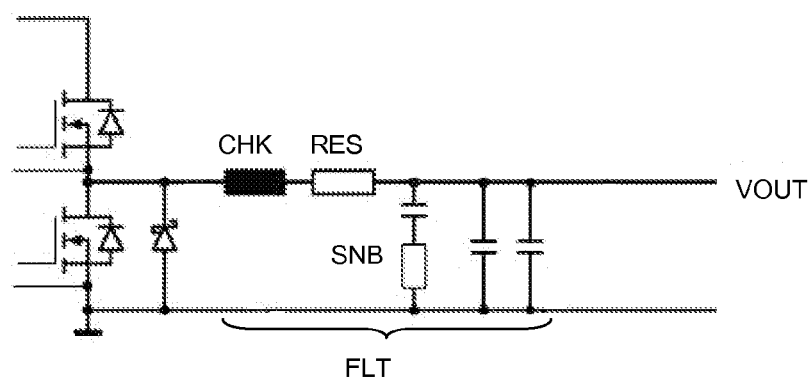
Figure 5C:
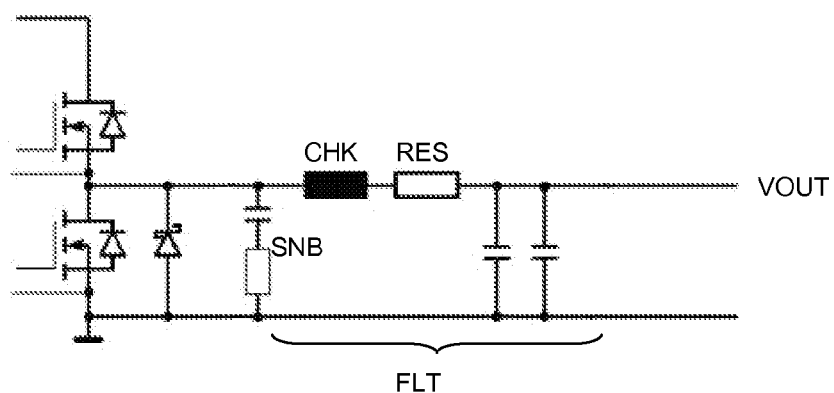

In order to quickly react to transients of the nominal value and keeping at the same time the voltage and current ripple as low as possible, a single or multistage output filter (FLT) is required. It is advantageous to operate this filter (FLT) close to the resonant frequency of the filter (FLT) in order to achieve the highest efficiency and best ripple suppression. To reduce any possible oscillations in the compound with the power amplifier according to the invention, a snubber (SNB) (attenuator consisting of a combination of RC) is connected parallel to the filter choke (CHK), the snubber then forming part of the filter. The snubber (SNB) may of course also be connected from the coil (CHK) input or output to ground or +V, causing approximately the same attenuation. The resistor (RES) in series with the filter choke (CHK) is inserted as a placeholder for the copper resistor of the choke (CHK) and plays a crucial role for the attenuation within the system. The resistor (RES) can also be considered as single components for additional improvement of the attenuation. Three different circuit topologies for combination of filter and snubber (SNB) are depicted in FIGS. 5a, 5b and 5c.

According to an embodiment of the present invention, there is provided a method for generating drain voltage (VOUT) for a power amplifier circuit (PA), the method using variable discrete-time signals which follow the envelope of an input RF signal (VIN) destined for the power amplifier (PA). The method comprises the steps of:
receiving a digital processed envelope signal ($ENV_{PA}$) from a processing module (DSP);
receiving constant supply voltage (VPS) from a regular constant voltage power supply (PS);
generating pulse-width-modulated (PWM) control signals for turning on and switching off the output FETs (amplifiers (AMP)), the output FETs being in parallel to achieve the required output voltage and current (VOUT) and very high switching frequency, which are needed for following the envelope closely;
receiving feedback samples (FBK) from output voltage and current (VOUT) to adjust the PWM control signals accordingly; and
filtering the combined output voltages (VOUT) of FETs (amplifiers (AMP)) to prevent unwanted oscillations and potential resonances with power amplifier equivalent inductance.

In the above method, there is no linear amplification for tracking the envelope. It follows that a circuit in which an embodiment of the present invention is realised does not require a linear amplifier. The amplifiers (amp) in the drain power supply module (DPSM) of the present invention may be current amplifiers, and therefore may be realised using a plurality of FETs or transistors. According to some embodiments there may be between 2 to 48 FETs or transistors in parallel in order to achieve very high switching speeds. Each FET or transistor can provide the maximum required voltage on its own. Through switching N FETs or transistors on and off at different phases, the final switching speed may be attained, this switching speed being N times the maximum switching speed of each FET, where the total number of FETs is N. The amplifiers (or amplifying elements (AMP)) are connected in parallel between ground and the substantially constant supply of DC power (VPS), and are each controlled by being driven during at least one phase, the at least one phase being independent of any other amplifying element, the at least one phase being based on the envelope signal and a feedback signal (FBK) based on at least part of the modulated power signal (VOUT).

The envelope signal ($ENV_{PA}$) may be derived from the input of the power amplifier (PA) using any of the techniques known in the state of the art.

As shown in FIG. 3, an embodiment of the present invention may be deployed in a system comprising a power supply (PS) to provide a substantially constant supply of DC power (VPS) for the drain power supply module (DPSM) of the present invention, a modulator (MOD) for providing pulse-width modulated data (PWM) envelope data derived from the envelope signal ($ENV_{PA}$) extracted from an input RF signal (VIN) and the power amplifier to be driven by the input signal VIN (or a signal derived therefore). According to particular embodiments, a feedback signal may be taken from the output (VOUT) of the drain power supply module (DPSM) to be processed in the signal processor (DSP) of the modulator (MOD) after having been converted using an analogue to digital converter (ADC) in the modulator (MOD).

The input signal (VIN) may be modulated in the modulator (MOD) before being received by the driver power supply module (DPSM) via a digital link (DL). According to different systems wherein an embodiment of the present invention may be deployed, the modulator may comprise an analogue to digital converter (ADC) to convert the input signal (VIN) into digital form, a DSP to process the converted input signal and a digital to analogue converter (DAC) to provide an input signal to the power amplifier.

Embodiments of the present invention provide for a drain power supply module circuit (DPSM) having a digital link (DL) to receive digital envelope data from a processing module (DSP) and to communicate with the processing module (DSP), the drain power supply module circuit (DPSM) comprising:
- a control circuit (CC) to generate PWM control signals for switching on and switching off the FETs (amplifiers (AMP)) at their maximum switching speed and at different phases;
- a driver circuit (DRV) to drive appropriate signaling to control the FETs (amplifiers (AMP));
- an array of FETs (amplifiers (AMP)) comprising a sufficient number of FETs (amplifiers (AMP)) to generate required voltages and supply enough current to supply the power amplifier (PA);
- a capacitor bank may be included to receive a constant supply voltage from a regular power supply (PS) and to provide, within a sufficiently short period, high enough currents as required by FET circuitry; and
- a filter (FLT) comprising sufficient elements to dampen unwanted oscillations and potential resonances with the power amplifier circuitry (PA).

According to an embodiment of the present invention there may be between 2 and 48 FETs in the above-mentioned array of FETs.

A flexible printed-circuit-board (Flex Print (ETC)) has been described for connecting the output stage of the drain power supply module (DPSM) to the input drain supply of a power amplifier (PA), to significantly decrease serial path induction and to simplify system integration process. This Flex Print comprises 2 parallel covered plates, one for output voltage and one for ground. This Flex Print (ETC) also provides the capability of mounting RLC filters in the path to power amplifier's drain supply.

FIG. 3 shows a power amplifier (PA) in a system in which an embodiment of the present invention may be deployed. The power amplifier (PA) may be any of the types selected among SSPAs (Solid-State Power Amplifiers) designed with any semiconductor technologies (LDMOS, GaN, GaAs), adapted to operate at any radio frequency band, including but not limited to, VHF, UHF, 4G Mobile/LTE, 3G Mobile, C-band, X-band and at any output power range. Furthermore, the modulator (MOD) and the signal processing module (DSP) may be configured to generate RF telecom signals of a type selected among DVB-T/H, ISDB-T, LTE/LTE advanced, DMB-T, DVB-T2, WCDMA, CDMA2000, and WiMax standards.

The invention claimed is:

1. A drain modulation power supply module for supplying modulated power to a power amplifier, the drain modulation power supply module comprising:
- a constant power input for receiving a substantially constant DC power supply;
- a digital input for receiving a processed digital envelope signal based on an input signal used to drive the power amplifier; and
- a control circuit for generating a plurality of timing signals;

wherein:
the drain modulation power supply module further comprises an array of amplifying elements connected in parallel with each other, the array comprising at least two amplifying elements, each of the amplifying elements being driven by one from the plurality of timing signals, the control circuit being further configured to generate each timing signal on a phase-by-phase basis depending on the processed digital envelope-signal.

2. The drain modulation power supply module according to claim 1, wherein the control circuit is still further configured to take into account a feedback signal based on the modulated power to the power amplifier.

3. The drain modulation power supply module according to claim 1, further comprising a capacitor bank connected to the constant power input.

4. The drain modulation power supply module according to claim 1, further comprising a filter to dampen oscillations within the power amplifier circuitry, said filter being connected to an output which provides the modulated power to the power amplifier.

5. A system comprising:
- a drain modulation power supply module according to claim 1 for supplying modulated power to a power amplifier; and
- a modulator;
wherein the modulator is configured to process an input signal used to drive the power amplifier, said processing of the input signal yielding an envelope signal, and to provide the envelope signal to the drain modulation power supply module via the digital input; and
wherein the modulator is further configured to input a feedback signal based on the modulated power to the amplifier module to track the envelope signal.

6. The system according to claim 5, wherein the modulated power is provided to the power amplifier via a flexible printed-circuit-board Flex Print, the flexible printed-circuit-board Flex Print comprising two parallel covered plates.

7. The system according to claim 6, wherein the printed circuit board Flex Print is configured to allow mounting of at least one RLC filter in the path to power amplifier's drain supply.

8. The system according to claim 5, wherein the power amplifier is of a Solid-State Power Amplifier type designed using a semiconductor technology selected from LDMOS, GaN or GaAs.

9. The system according to claim 5, wherein the modulator further comprises a signal processing module at least for processing the envelope signal to provide the modulated signal, the modulator and the signal processing module being configured to generate RF telecom signals of a type selected from among the group consisting of the DVB-T/H, ISDB-T, LTE/LTE advanced, DMB-T, DVB-T2, WCDMA, CDMA2000, and WiMax standards.

* * * * *